US009590763B2

(12) United States Patent
Hellgren et al.

(10) Patent No.: US 9,590,763 B2
(45) Date of Patent: Mar. 7, 2017

(54) ENERGY EFFICIENT TRANSMITTER POWER CONTROL

(71) Applicant: Telefonaktiebolaget L M Ericsson (publ), Stockholm (SE)

(72) Inventors: Filip Hellgren, Kållered (SE); Björn Gävert, Göteborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 3 days.

(21) Appl. No.: 14/442,418

(22) PCT Filed: May 11, 2015

(86) PCT No.: PCT/EP2015/060348
§ 371 (c)(1),
(2) Date: May 13, 2015

(87) PCT Pub. No.: WO2016/180465
PCT Pub. Date: Nov. 17, 2016

(65) Prior Publication Data
US 2016/0337074 A1 Nov. 17, 2016

(51) Int. Cl.
*H04L 1/00* (2006.01)
*H04W 52/34* (2009.01)
(Continued)

(52) U.S. Cl.
CPC ............. *H04L 1/0009* (2013.01); *H04B 1/40* (2013.01); *H04L 1/0003* (2013.01);
(Continued)

(58) Field of Classification Search
CPC . H04L 1/0003; H04L 1/0009; H04L 27/0008; H04L 2001/0416; H04L 1/0026; H04B 2001/0416; H04B 1/40; H04B 2001/0408; H04W 52/343; H04W 52/383; H04W 52/262; H04W 52/281
See application file for complete search history.

(56) References Cited

U.S. PATENT DOCUMENTS 6,137,789 A * 10/2000 Honkasalo ............ H04L 1/0002
370/342
6,714,522 B1 3/2004 Lee
(Continued)

FOREIGN PATENT DOCUMENTS

WO 0180445 A2 10/2001

*Primary Examiner* — Sophia Vlahos
(74) *Attorney, Agent, or Firm* — Coats & Bennett, P.L.L.C.

(57) ABSTRACT

A microwave transceiver comprising a data buffer, an ACM module, a PA, and an antenna. The ACM module configured to receive buffered data from the data buffer and to modulate the buffered data at a modulation format having a spectral efficiency, the PA configured to receive modulated buffered data from the ACM module, and to transmit amplified modulated buffered data, via the antenna, to a remote microwave transceiver at an output power. The modulation format is selected from a plurality of modulation formats based on a feedback signal from the remote microwave transceiver. The microwave transceiver further comprising a control module configured to monitor a buffer state of the data buffer, and to control the output power of the PA based on the buffer state.

27 Claims, 6 Drawing Sheets

(51) Int. Cl.
*H04W 52/38* (2009.01)
*H04B 1/40* (2015.01)
*H04L 27/00* (2006.01)
*H04B 1/04* (2006.01)
*H04W 52/26* (2009.01)
*H04W 52/28* (2009.01)

(52) U.S. Cl.
CPC ......... *H04L 1/0026* (2013.01); *H04W 52/343* (2013.01); *H04W 52/383* (2013.01); *H04B 2001/0408* (2013.01); *H04B 2001/0416* (2013.01); *H04L 27/0008* (2013.01); *H04W 52/262* (2013.01); *H04W 52/281* (2013.01)

(56) References Cited

U.S. PATENT DOCUMENTS

| | | | |
|---|---|---|---|
| 6,912,228 B1* | 6/2005 | Dahlman | H04W 52/223 370/347 |
| 7,454,222 B2* | 11/2008 | Huang | H04L 1/0003 455/226.1 |
| 7,756,023 B2* | 7/2010 | Fuss | H04L 1/0001 370/230 |
| 8,458,380 B2* | 6/2013 | Chaudhuri | G06F 15/7842 710/52 |
| 2004/0018849 A1* | 1/2004 | Schiff | H04W 52/267 455/522 |
| 2004/0110477 A1* | 6/2004 | Nishimura | H04W 52/12 455/127.1 |
| 2005/0075078 A1 | 4/2005 | Makinen et al. | |
| 2007/0082620 A1* | 4/2007 | Zhang | H04W 52/24 455/69 |
| 2008/0242339 A1* | 10/2008 | Anderson | H04B 7/18543 455/522 |
| 2014/0266867 A1* | 9/2014 | Liu | G01S 1/042 342/200 |
| 2015/0085794 A1* | 3/2015 | Chen | H04B 7/0413 370/329 |

* cited by examiner

| Buffer State (% of Total Buffer Capacity) | Power Level (% of Maximum Total Output Power) |
|---|---|
| 0% | 0% |
| 20% | 20% |
| 40% | 40% |
| 60% | 60% |
| 80% | 80% |
| 100% | 100% |

Fig 6

ENERGY EFFICIENT TRANSMITTER POWER CONTROL

TECHNICAL FIELD

The present disclosure relates to wireless communication systems, and in particular to transmitter power control for point to point microwave radio links implementing adaptive coding and modulation (ACM).

BACKGROUND

A microwave radio link or radio link system is a communication system that transmits data between two fixed locations over a point-to-point link. A microwave radio link transmitter and receiver are often incorporated into one unit, herein denoted as microwave transceiver.

Radio transmission, such as microwave radio transmission, often interferes with neighboring communication systems. Such interference may, if the microwave radio transmission is strong enough, degrade performance of the neighboring communication systems, at least in case of overlapping frequency spectrum. A reduction of radio interference in wireless communication systems is therefore wanted.

Power consumption is an important contributor to the cost of ownership for data transmission systems, such as microwave radio links. As networks grow denser, power consumption becomes even more important due to an increasing number of radio links. It is not only the OPerating EXpenditures (OPEX) for electrical energy which are increasing, but also CApital EXpenditures (CAPEX) related to, e.g., dimensioning of the power distribution is increasing. Thus, power consumption is an issue negatively affecting total cost of ownership (TCO) in communication systems, and a reduction in power consumption is therefore wanted.

SUMMARY

An object of the present disclosure is to provide a microwave transceiver, a DSP circuit, and methods which seek to mitigate, alleviate, or eliminate one or more of the above-identified deficiencies in the art and disadvantages singly or in any combination.

This object is obtained by a microwave transceiver comprising a data buffer, an adaptive coding and modulation, ACM, module, a power amplifier, PA, and an antenna. The ACM module is configured to receive buffered data from the data buffer and to modulate the buffered data at a modulation format having a spectral efficiency. The PA is configured to receive modulated buffered data from the ACM module, and to transmit amplified modulated buffered data, via the antenna, to a remote microwave transceiver at an output power. The modulation format is selected from a plurality of modulation formats based on a feedback signal from the remote microwave transceiver. The microwave transceiver further comprises a control module configured to monitor a buffer state of the data buffer, and to control the output power of the PA based on the monitored buffer state.

Hereby, total cost of ownership of the microwave transceiver is reduced. In particular, reduced power consumption by the microwave transceiver is obtained due to the controlling of PA output power.

Furthermore, a spectral efficiency suitable for current traffic conditions is selected, leading to reduced signal processing by the microwave transceiver, and thus to a reduction in power consumption by the microwave transceiver.

Hereby, radio interference to neighboring communication systems is also reduced, due to the controlling of output power of the PA.

The reduction in power consumption obtained by the present technique may also affect mean-time-before-failure (MTBF) in a positive way, since components, in particular the PA, are running colder during certain time periods.

According to some aspects, the buffer state comprises a buffer fill level of the data buffer. The buffer fill level indicates when the buffer state is such as to allow a reduction in spectral efficiency of transmission without risking buffer overflow.

Consequently, according to aspects, the control module is configured to decrease the output power of the PA when the buffer fill level is below a first pre-determined threshold, and to increase the output power of the PA when the buffer fill level is above a second pre-determined threshold.

According to some other aspects, the buffer state comprises a priority level of data currently in the data buffer. The control module is then configured to increase the output power of the PA when the priority level of data currently in the data buffer is above a priority threshold, and to decrease the output power of the PA when the priority level of data currently in the data buffer is below a priority threshold.

Hereby, high priority data is not affected by, or is less affected by, increases in transmission delay due to the controlling of output power of the PA and consequent changes in spectral efficiency of data transmission by the microwave transceiver.

According to some further aspects, the buffer state comprises a predicted future buffer fill level, and the control module is then configured to control the output power of the PA based on the predicted future buffer fill level.

Hereby, a faster response to changes in buffer state is obtained, leading to, e.g., a reduced risk of buffer overflows and reduced transmission delay.

The above-mentioned object is also obtained by a Digital Signal Processor, DSP, circuit comprising an input data port, a data buffer and an adaptive coding and modulation, ACM, module. The data buffer is configured to receive data on the input data port and to output buffered data to the ACM module on an output data port. The ACM module is configured to receive and to modulate the buffered data at a modulation format having a spectral efficiency, and to output the modulated buffered data on an output port of the DSP circuit. The modulation format is selected from a plurality of modulation formats based on a feedback signal received on an ACM feedback port of the DSP circuit. The DSP circuit further comprises a control module configured to monitor a buffer state of the data buffer, and to output a power control signal on a power control port of the DSP circuit for controlling an output power of a power amplifier, PA, connectable to the DSP circuit, based on the monitored buffer state.

There is also disclosed herein a device comprising the above DSP circuit, and also a method in a DSP circuit for controlling a spectral efficiency of data transmission by the DSP circuit. The DSP circuit comprises a data buffer and an adaptive coding and modulation, ACM, module. The ACM module is configured to modulate buffered data received from the data buffer at a modulation format having a spectral efficiency. The method comprises monitoring a buffer state of the data buffer and generating a power control signal for controlling an output power of a PA connectable to the DSP circuit based on the monitored buffer state.

In addition to the disclosed methods, there are also provided herein computer programs comprising computer program code which, when executed in a DSP circuit causes the DSP circuit to execute methods according to the present teaching.

The DSP circuit, the device comprising the DSP circuit, the computer programs and the methods, all display advantages corresponding to the advantages already described in relation to the microwave transceiver.

BRIEF DESCRIPTION OF THE DRAWINGS

Further objects, features, and advantages of the present disclosure will appear from the following detailed description, wherein some aspects of the disclosure will be described in more detail with reference to the accompanying drawings, in which.

DETAILED DESCRIPTION

Figure 1:
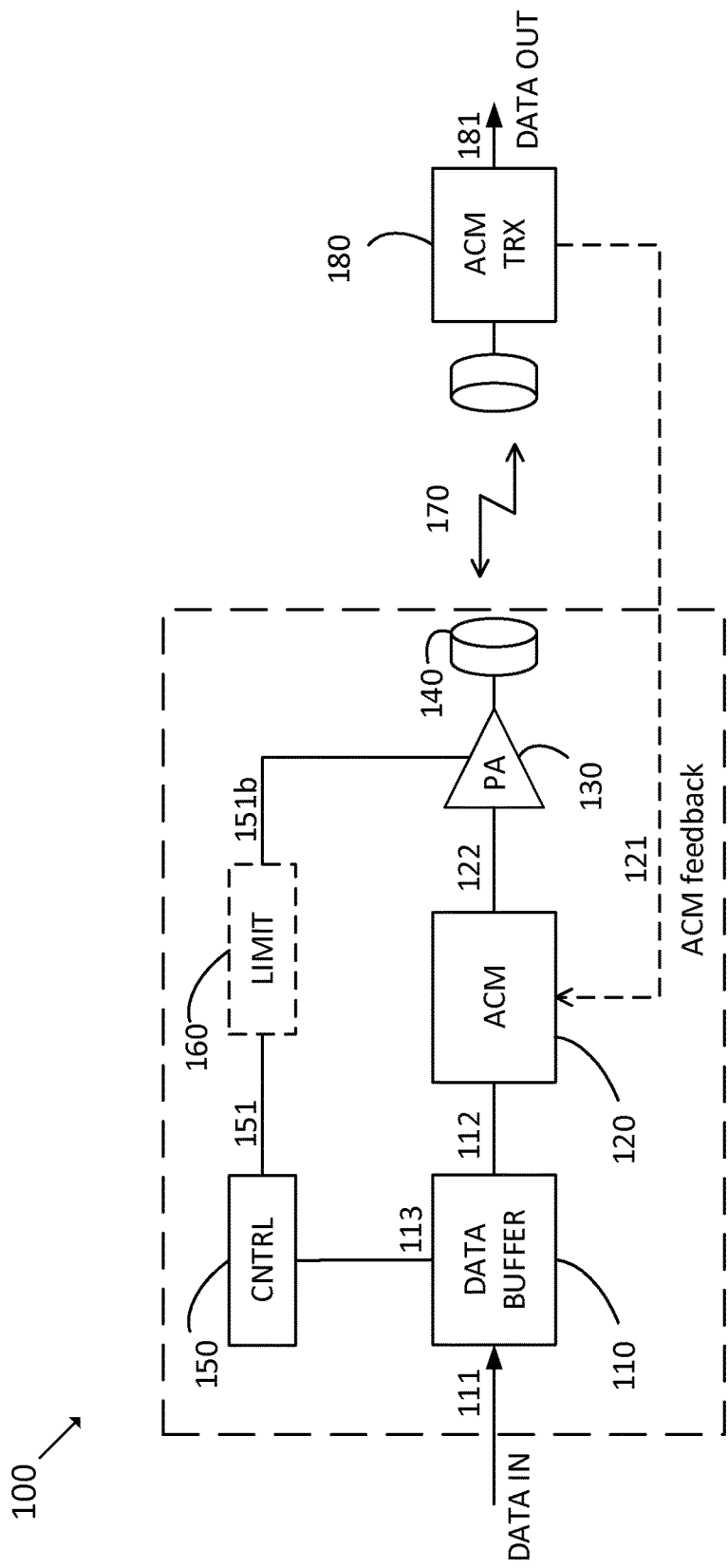
FIG. 1 is a block diagram illustrating a radio link according to the present disclosure.

The present teaching relates to optimization of energy consumption in communication systems, and in particular to optimization of energy consumption in microwave radio links implementing data transmission by adaptive coding and modulation (ACM) or adaptive coding and modulation and baudrate (ACMB).

A main idea of the present disclosure relates to regulating an output power of a power amplifier (PA) used for data transmission based on a buffer state of a data buffer. The output power regulation is done such that PA output power is decreased when there is only little data, or data having a lower priority level, to be transmitted, and increased as the buffer fills up or when the buffer contains high priority data.

This results in that the ACM system automatically responds to the changed power level by regulating spectral efficiency of data transmission to match the current power level, whereby transmission errors are avoided despite the reduction in output power. Power consumption by the microwave transceiver is reduced due to the controlling of output power of the PA, which leads to reduced total cost of ownership (TCO). Another advantage of the present technique is that spectral efficiency need not be controlled specifically, since this is handled by the existing ACM system, which enables an efficient implementation of the proposed techniques.

Also, by the proposed technique, a spectral efficiency suitable for current traffic conditions is selected, leading to reduced processing requirements on the microwave transceiver, and thus to a further reduction in power consumption by the microwave transceiver.

An issue with almost any electronic device is component wear or component aging, leading eventually to malfunction of the device. A measure of component aging is its mean-time-before-failure (MTBF). It is known that a hot component operating in high load conditions often ages faster than a component allowed to operate under less stress, i.e., operating in a colder state. Thus, the reduction in power consumption obtained by the present technique also affects MTBF in a positive way as components, in particular the PA, are running colder.

Hereby, radio interference to neighboring communication systems is also reduced, due to the controlling of output power of the PA.

A further advantage stemming from transmission at reduced spectral efficiency is an increased resilience of the microwave transceiver to external interference.

Aspects of the present disclosure will now be described more fully with reference to the accompanying drawings. The apparatus, computer program and methods disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the invention. As used herein, the singular forms "a", "an" and "the" are intended to include the plural forms as well, unless the context clearly indicates otherwise.

FIG. 1 illustrates a radio link according to the present disclosure. In particular, there is shown a microwave transceiver 100, comprising a data buffer 110, an adaptive coding and modulation (ACM) module 120, a power amplifier (PA) 130 and an antenna 140. The microwave transceiver 100 is arranged to communicate over a point-to-point link 170 with a remote microwave transceiver 180. Thus, data input to the data input port 111 is transmitted over the radio link and output from the remote microwave transceiver 180 on an output data port 181. The microwave transceiver 100 constitutes one point of a point-to-point microwave radio link 170, and the remote microwave transceiver 180 constitutes another point of said point-to-point microwave radio link 170.

The microwave transceiver 100 shown in FIG. 1, and discussed herein, only shows a transmitter chain ending with the PA 130 and antenna 140. However, it is appreciated that a transceiver normally also comprises a receiver chain for receiving data over the point-to-point link 170. This is indicated by the double direction arrows of the point-to-point link 170.

The microwave transceiver 100 implements ACM, or, according to some aspects, implements adaptive coding, modulation, and baudrate (ACMB). ACM is a mechanism which adjusts a spectral efficiency, usually measured in bits/sec/Hz, of data transmission according to current transmission conditions. Thus, as attenuation over the hop and/or interference increases the spectral efficiency of transmission is reduced, and increased when transmission conditions improve. Since reducing spectral efficiency leads to improvements in detection resilience, low error rates can be maintained throughout periods of reduced transmission conditions. ACM usually involves feedback, via an ACM feedback channel 121, from a receiver of the transmitted data which is used to determine a suitable level of modulation and/or coding, i.e., a modulation format and a channel code, which together determine the spectral efficiency of data transmission. ACMB, in addition to varying spectral efficiency of the transmitted signal, further varies a baudrate of the transmitted signal, thereby varying an occupied channel frequency bandwidth of the transmitted signal.

Thus, the ACM module 120 is configured to receive buffered data from the data buffer 110 and to modulate the buffered data at a modulation format having a spectral efficiency. The PA 130 is configured to receive modulated buffered data from the ACM module 120, and to transmit amplified modulated buffered data, via the antenna 140, to a remote microwave transceiver 180 at an output power.

The modulation format is selected from a plurality of modulation formats based on a feedback signal from the remote microwave transceiver 180. Examples of modulation formats include different orders of quadrature amplitude modulation (M-QAM), phase shift keying (M-PSK). Further examples include various modulation formats used together with orthogonal frequency division multiplexing (OFDM).

The microwave transceiver 100 further comprises a control module 150 configured to monitor a buffer state of the data buffer 110, and to control the output power of the PA 130 based on the monitored buffer state.

By monitoring the buffer state, e.g., a buffer fill level, a buffer read/write pointer, a buffer fill rate, or similar, and controlling PA output power based on the monitored state, a sequence of events is started. This sequence of events will be further discussed below in connection to FIG. 3, but suppose for instance that the buffer fill level is such as to allow transmission at a reduced spectral efficiency without risking buffer overflow. In this case the PA output power is reduced at the transmitter. The receiver 180 then detects a corresponding drop in received signal quality, which prompts an ACM feedback signal 121 from the receiver requesting a modulation format and/or coding with reduced spectral efficiency to account for the drop in received signal quality. Consequently, the reduction in output power results in an automatic adjustment in transmission rate, by the ACM system, to maintain data transmission at low error rate but using a reduced output power.

Herein, signal quality is to construed broadly, comprising e.g., signal power, signal to noise ratio (SNR), signal to noise and interference ratio (SNIR), mean squared detection error (MSE), and the like which can be used to determine the ACM feedback signal 121.

Consequently, according to some aspects, the control module 150 is configured to decrease the output power of the PA 130 when the buffer fill level is below a first pre-determined threshold.

According to further aspects, the control module 150 is configured to regulate output power continuously according to a pre-determined or configured function of buffer fill level. According to some other aspects, the control module 150 is configured to increase the output power of the PA 130 when the buffer fill level is above a second pre-determined threshold.

As already mentioned above, not only buffer fill level can be of interest when controlling PA output power, but also buffer fill rate, or properties of currently buffered data. One such example is a priority level of buffered data, e.g., a priority level indicated in a data header of a data packet, such as an internet protocol (IP) packet. Thus, according to some aspects, the buffer state comprises a priority level of data currently in the data buffer, and the control module 150 is configured to increase the output power of the PA 130 when the priority level of data currently in the data buffer meets pre-determined criteria, and to decrease the output power of the PA 130 when the priority level of data currently in the data buffer meets other pre-determined criteria.

Examples of said pre-determined criteria include priority levels, different packet types, packet size, or information indicating different data streams which are to be given priority. One reason behind the controlling of output power based on priority level is that some data types may be sensitive to delay, in which case this data should preferably be transmitted at high rate to minimize transmission delay regardless of buffer state in general.

It is, in some cases, possible to predict future buffer states based on past buffer states. One example is by extrapolating buffer fill levels as function of time, in which case future buffer fill levels can be estimated. In other words, according to some aspects, the buffer state comprises a predicted future buffer fill level, and the control module 150 is configured to control the output power of the PA 130 based on the predicted future buffer fill level. Another example is storing arrival times of high priority data, from which a pattern of arrival times can be deduced, for instance, high priority video streams may only occur during office hours. Yet another example is to simply mark the first arrival occurrence of high priority data, reasoning that this single occurrence indicates a possibility of more high priority data arriving in near future in which case transmission rates should be maintained high.

Control of PA output power can be actuated in different ways, according to different aspects, some of which will now be described. According to some such aspects, the control module 150 is configured to control the output power of the PA 130 over a continuous range of output powers between a minimum and a maximum output power level.

According to some other such aspects, the control module 150 is configured to select an output power of the PA 130 from a plurality of discrete output powers.

It is furthermore appreciated that the output power of the PA 130 should preferably not be changed abruptly in too large steps, since such large abrupt changes in output power can lead to detection error at the receiver side, due to bandwidth limitation in automatic gain control (AGC) at the receiver 180. Thus, the output power of the PA is, according to some aspects, changed at a pre-determined rate of change, given in W/sec, and/or according to a pre-determined maximum step-size, given in W/step.

The output power of the PA 130 can be set in a number of different ways, for instance, according to some aspects, the control module 150 is configured to select an output power of the PA 130 from a look-up-table (LUT) of power levels indexed by buffer state.

According to some aspects, the microwave transceiver 100 comprises a limiter module 160. The limiter module 160 is configured to limit the control of the output power of the PA 130 to output powers above a minimum output power and/or to output powers below a pre-determined maximum output power. It is appreciated that this type of limiter module can be integrated with an automatic transmit power control (ATPC) system, wherein the limiter module limits the output power within an acceptable range where data transmission at a given error rate performance is possible.

According to some aspects, the ACM module 120 is further configured to select a channel code, and/or a corresponding code rate from a plurality of channel codes and/or code rates, and to apply said channel code in modulating the buffered data, said spectral efficiency being determined by the selected modulation format and by the selected channel code and/or code rate.

Figure 2:
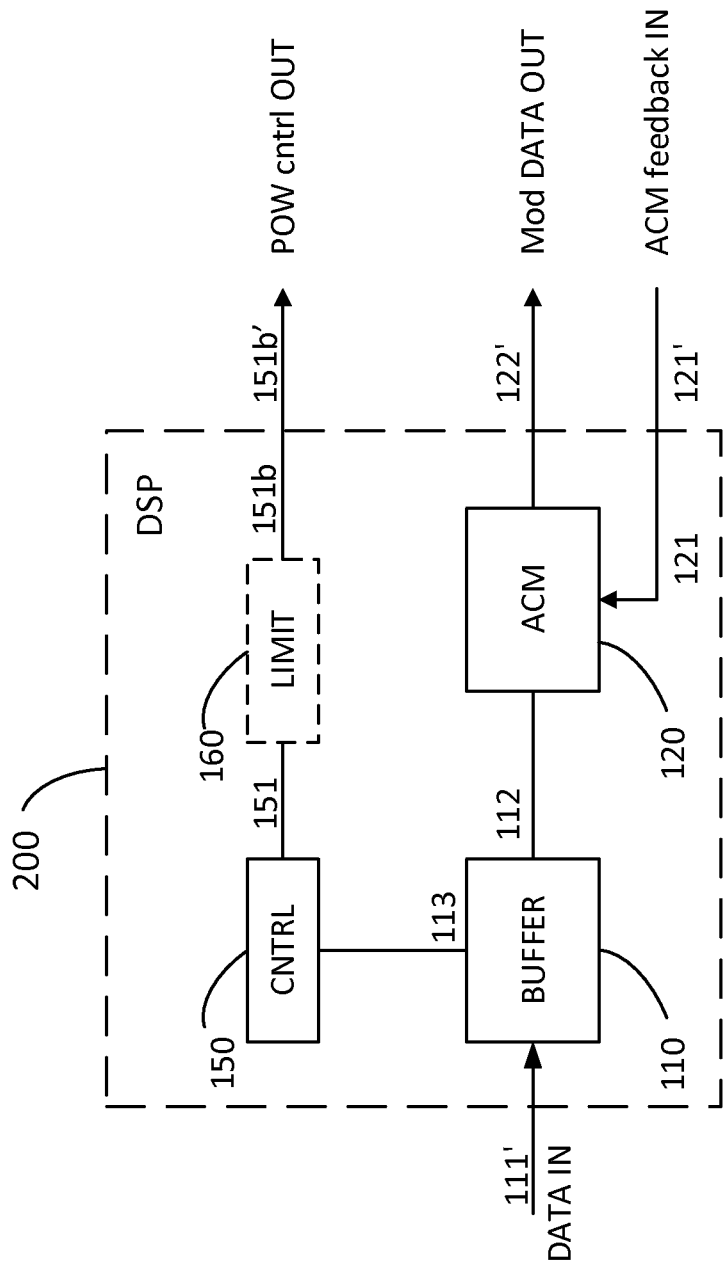
FIG. 2 is a block diagram illustrating a digital signal processing circuit according to the present disclosure.

FIG. 2 is a block diagram illustrating a digital signal processing (DSP) circuit according to the present disclosure, comprising an input data port 111', a data buffer 110 and an adaptive coding and modulation, ACM, module 120. The data buffer 110 being configured to receive data on the input data port 111' and to output buffered data to the ACM module 120 on an output data port 112. The ACM module is configured to receive and to modulate the buffered data at a modulation format having a spectral efficiency, and to output the modulated buffered data on an output port 122' of the DSP circuit 200, wherein the modulation format is selected from a plurality of modulation formats based on a feedback signal 121 received on an ACM feedback port 121' of the DSP circuit 200. The DSP circuit 200 further comprises a control module 150 configured to monitor a buffer state of the data buffer 110, and to output a power control signal 151, 151b on a power control port 151b' of the DSP circuit 200 for controlling an output power of a power amplifier, PA, connectable to the DSP circuit 200 based on the monitored buffer state.

According to aspects, the DSP circuit 200 further comprises a limiter module 160. The limiter module 160 is configured to limit the power control signal 151, 151b to correspond to output powers above a pre-determined minimum output power of the PA and/or to correspond to output powers below a pre-determined maximum output power of the PA.

The DSP circuit provides functionality corresponding to the above discussion related to microwave transceivers. In fact, according to one embodiment, the microwave transceiver 100 shown in FIG. 1 comprises the DSP circuit 200. For reasons of brevity, the DSP circuit 200 or other devices comprising said DSP circuit 200, will not be further discussed here, instead referring to the discussion on the microwave transceivers above.

Figure 3:
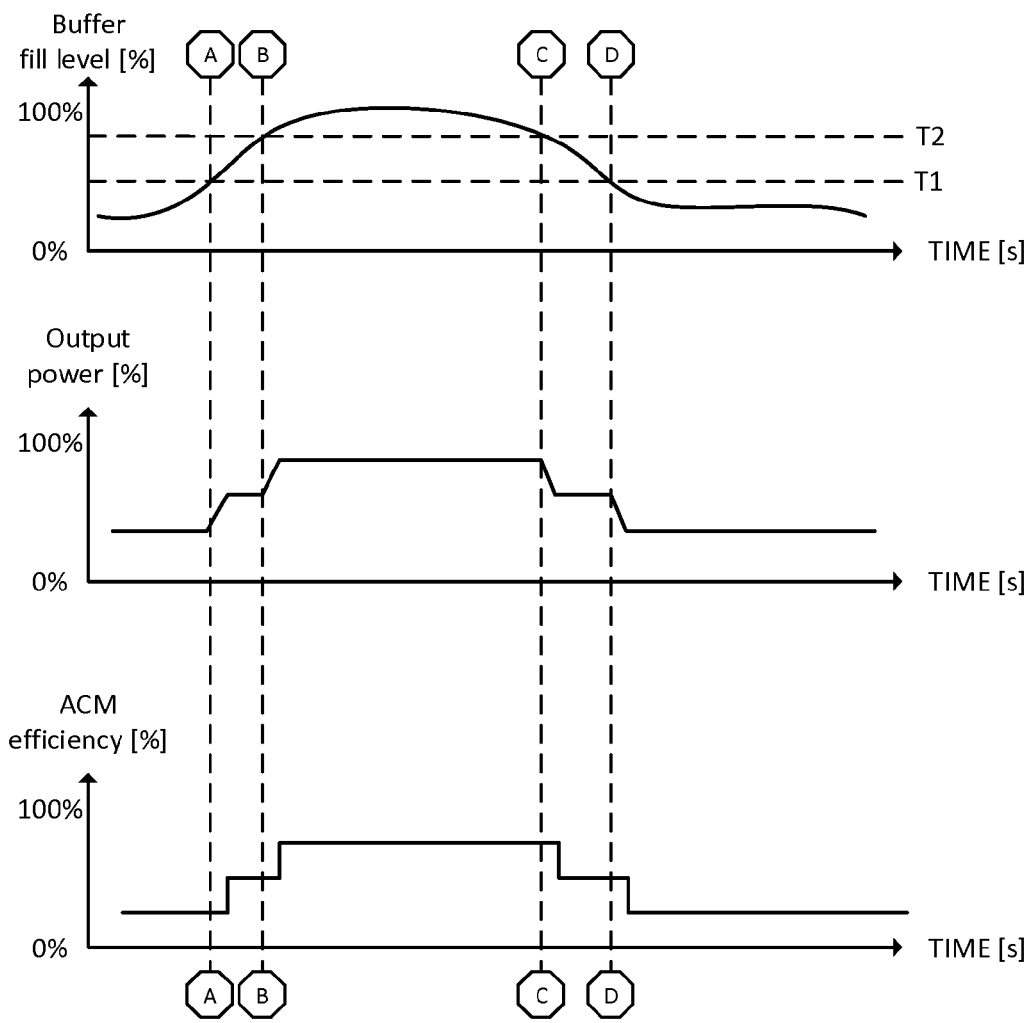
FIG. 3 shows graphs illustrating an example sequence of events according to aspects of the present disclosure.

FIG. 3 shows graphs illustrating an example sequence of events according to the present disclosure, in order to provide a better understanding of the proposed technique. According to the illustrated scenario, the traffic influx to the data buffer varies over time. First there is a rise in buffer fill level, followed by a period of relatively stable buffer fill level, and ending with a decline in buffer fill level. Buffer fill level is here measured in percentage of total buffer capacity. Aligned in time with the graph on buffer fill level are shown output power by the PA, and spectral efficiency by the ACM. Output power is here measured in percentage of maximum total output power. ACM efficiency is here measured in percentage of maximum available spectral efficiency. Four events, A-D, are marked by dashed lines.

At event 'A' the monitored buffer fill level percentage rises above a first threshold T1. This results in that PA output power is increased, here according to a ramp function. The increase in output power results in improved reception conditions at the receiver, which in turn prompts an increase in spectral efficiency of data transmission by the ACM system. At event 'B' the buffer fill level rises above a second threshold T2, which prompts a further increase in PA output power, followed by a further increase in spectral efficiency of data transmission. This spectral efficiency is maintained until event 'C' occurs, where the buffer fill level again goes below the second threshold T2, whereupon output power is reduced, resulting in a decrease in spectral efficiency of data transmission. At event 'D', the buffer fill level goes below the first threshold T1, resulting in a further decrease in spectral efficiency of data transmission.

In terms of power consumption, a lower power consumption can be expected prior to event 'A', and following even 'D', compared to the period in between event 'B' and 'C', where a high output power is used.

Figure 4:
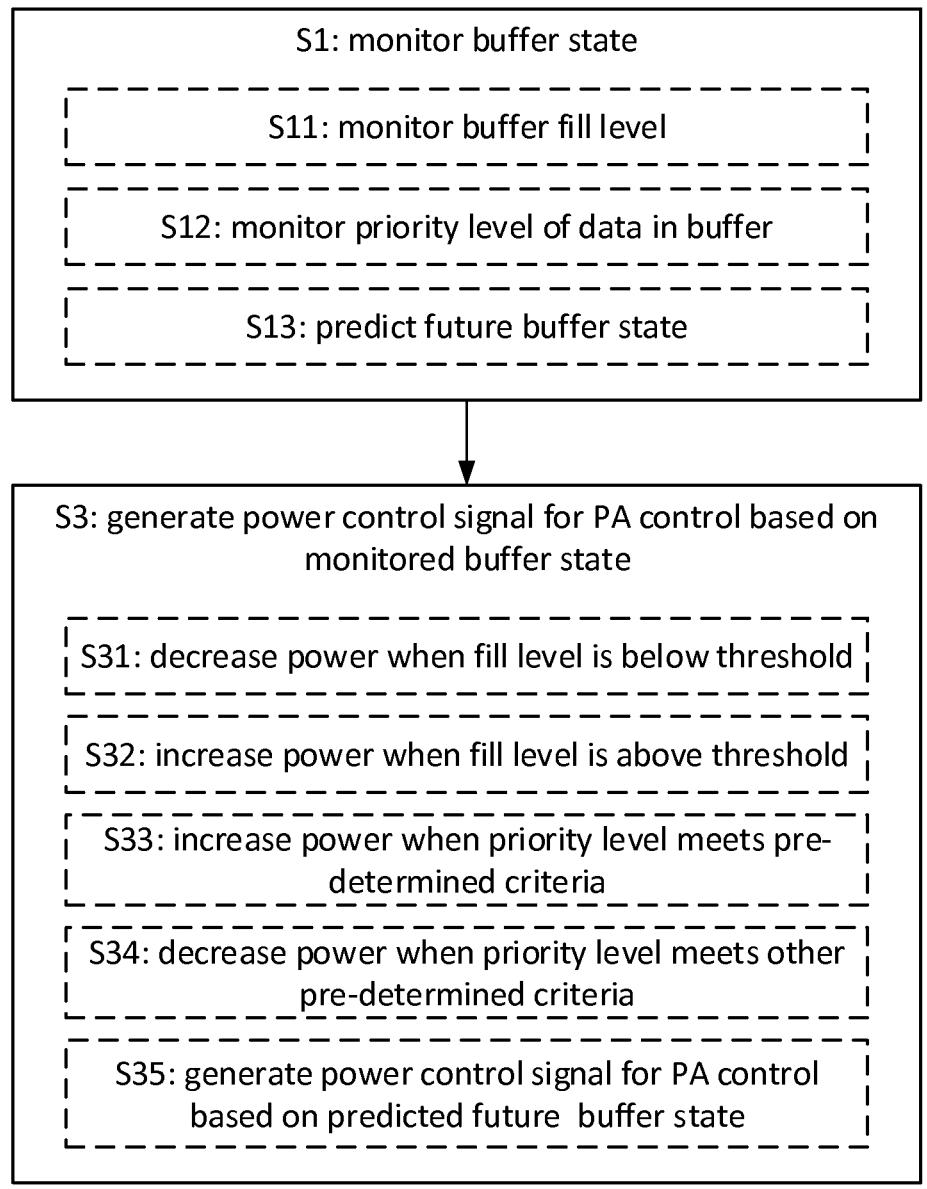
FIG. 4 is a flowchart illustrating methods according to the present disclosure.

FIG. 4 is a flowchart illustrating methods according to the present disclosure. In particular, there is illustrated a method in a DSP circuit 200 for controlling a spectral efficiency of data transmission by the DSP circuit. The DSP circuit 200 corresponds to the DSP circuit shown in FIG. 2 and discussed above, i.e., it comprises a data buffer 110 and an adaptive coding and modulation, ACM, module 120. The ACM module 120 is configured to modulate buffered data received from the data buffer 110 at a modulation format having a spectral efficiency. The method comprises monitoring S1 a buffer state of the data buffer 110 and generating S3 a power control signal 151, 151b for controlling an output power of a PA 130 connectable to the DSP circuit 200, based on the monitored buffer state.

According to aspects, the monitoring S1 comprises monitoring S11 a buffer fill level of the data buffer 110.

According to aspects, the monitoring S1 comprises predicting S12 a future buffer fill level of the data buffer 110.

According to aspects, the monitoring S1 comprises monitoring S13 a priority level of data currently in the data buffer 110.

According to aspects, the generating S3 further comprises generating a power control signal for decreasing S31 the output power of the PA 130 when the buffer fill level, or predicted future buffer fill level, is below a first pre-determined threshold.

According to aspects, the generating S3 further comprises generating a power control signal for increasing S32 the output power of the PA 130 when the buffer fill level, or predicted future buffer fill level, is above a second pre-determined threshold.

According to aspects, the generating S3 further comprises generating S35 the power control signal based on the predicted future buffer fill level.

According to aspects, the generating S3 further comprises generating a power control signal for increasing S33 the output power of the PA 130 when the priority level of data currently in the data buffer is above a priority threshold, and wherein the generating S3 further comprises generating a power control signal for decreasing S34 the output power of the PA 130 when the priority level of data currently in the data buffer is below a priority threshold.

Above aspects of the disclosed method have already been discussed in connection with corresponding functions and features of the DSP circuits and microwave transceivers, and will therefore not be discussed again here.

Figure 5:
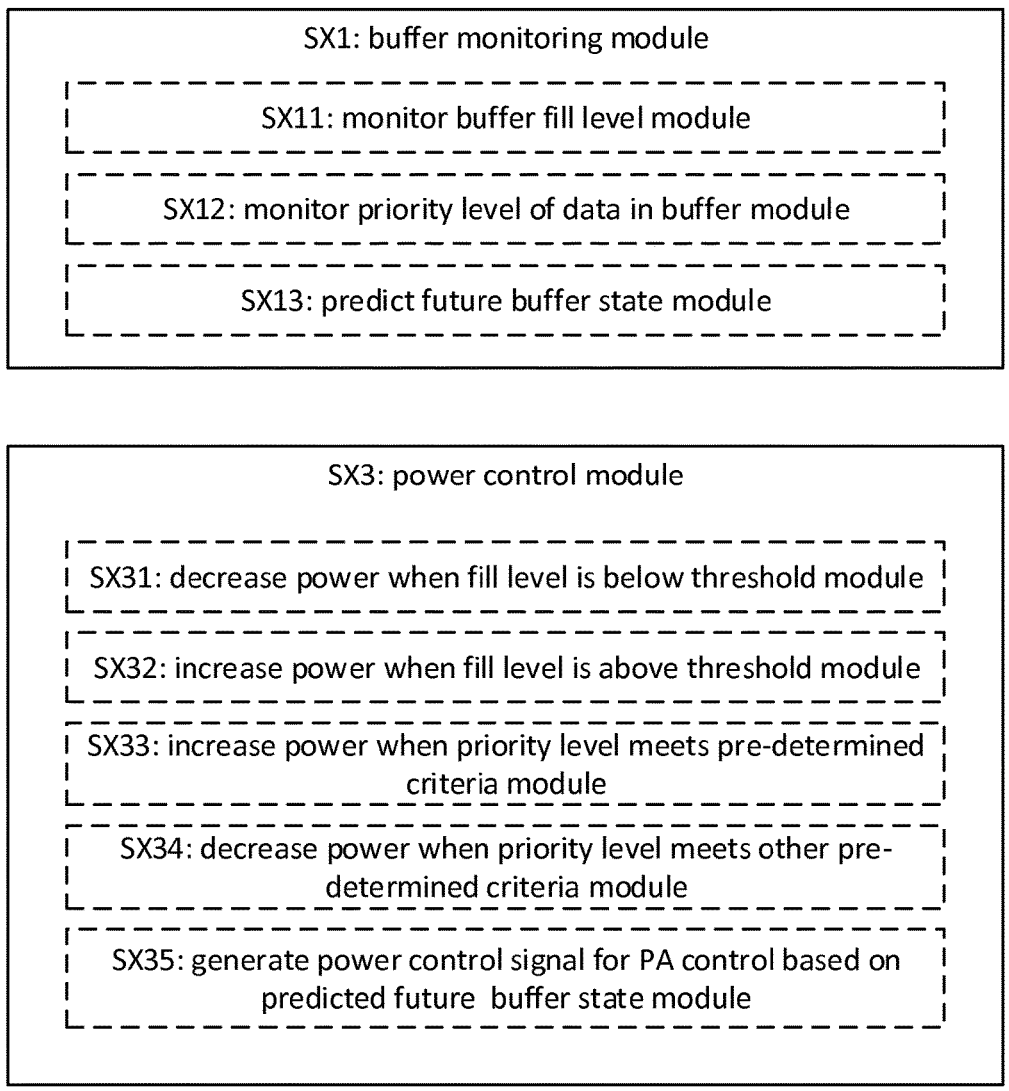
FIG. 5 is a block diagram illustrating a DSP circuit according to the present disclosure.

FIG. 5 is a block diagram illustrating a DSP circuit for controlling a spectral efficiency of data transmission by the DSP circuit according to the present disclosure. The DSP circuit comprises a buffer monitoring module SX1 configured to monitor a buffer state of a data buffer 110 of the DSP circuit, and a power control module SX3 configured to generate a power control signal of the DSP circuit for controlling an output power of a PA 130 connectable to the DSP circuit 200, based on the monitored buffer state.

In addition to the buffer monitoring and power control modules, the DSP circuit, according to some aspects, comprises further modules SX11-SX13, and SX31-SX35. These modules are configured to perform functions corresponding to method steps discussed above in connection to FIG. 4.

The various aspects of the methods described herein are described in the general context of method steps or processes, which may be implemented in one aspect by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Generally, program modules may include routines, programs, objects, components, data structures, etc., that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

The invention claimed is:

1. A microwave transceiver, comprising:
a data buffer;
an adaptive coding and modulation (ACM) circuit, the ACM circuit configured to receive buffered data from the data buffer and to modulate the buffered data at a modulation format having a spectral efficiency;
an antenna;
a power amplifier (PA), the PA configured to receive modulated buffered data from the ACM circuit, and to transmit amplified modulated buffered data, via the antenna, to a remote microwave transceiver at an output power;
a control circuit configured to monitor a buffer state of the data buffer, and to control an output power of the PA based on the monitored buffer state;
wherein a modulation format is selected from a plurality of modulation formats based on a feedback signal from the remote microwave transceiver, and wherein the control circuit is configured to control the output power of the PA independently of any modulation of the buffered data by the ACM circuit.

2. The microwave transceiver of claim 1, wherein the buffer state comprises a buffer fill level.

3. The microwave transceiver of claim 2, wherein the control circuit is configured to decrease the output power of the PA when the buffer fill level is below a first predetermined threshold.

4. The microwave transceiver according to claim 2, wherein the control circuit is configured to increase the output power of the PA when the buffer fill level is above a second predetermined threshold.

5. The microwave transceiver of claim 1:
wherein the buffer state comprises a priority level of data currently in the data buffer;
wherein the control circuit is configured to:
increase the output power of the PA when the priority level of data currently in the data buffer is above a priority threshold; and
decrease the output power of the PA when the priority level of data currently in the data buffer is below the priority threshold.

6. The microwave transceiver of claim 1:
wherein the buffer state comprises a predicted future buffer fill level;
wherein the control circuit is configured to control the output power of the PA based on the predicted future buffer fill level.

7. The microwave transceiver of claim 1, wherein the control circuit is configured to control the output power of the PA over a continuous range of output powers between a minimum and a maximum output power level.

8. The microwave transceiver claim 1, wherein the control circuit-is configured to select an output power of the PA from a plurality of discrete output powers.

9. The microwave transceiver of claim 8, wherein the control circuit is configured to select an output power of the PA from a look-up-table (LUT) of power levels indexed by buffer state.

10. The microwave transceiver of claim 1, further comprising a limiter circuit, the limiter circuit configured to limit the control of the output power of the PA to output powers above a minimum output power and/or to output powers below a pre-determined maximum output power.

11. The microwave transceiver of claim 1:
wherein the ACM circuit is further configured to:
select a channel code and/or a corresponding code rate from a plurality of channel codes and/or code rates;
apply the channel code in modulating the buffered data,
wherein the spectral efficiency is determined by the selected modulation format and by the selected channel code and/or code rate.

12. The microwave transceiver of claim 1, wherein:
the microwave transceiver constitutes one point of a point-to-point microwave radio link;
the remote microwave transceiver constitutes another point of said point-to-point microwave radio link.

13. A Digital Signal Processor (DSP) circuit, comprising:
an input data port;
an adaptive coding and modulation (ACM) circuit;
a data buffer configured to receive data on the input data port and to output buffered data to the ACM circuit on an output data port;
a control circuit configured to monitor a buffer state of the data buffer, and to output a power control signal on a power control port of the DSP circuit for controlling an output power of a power amplifier (PA) connectable to the DSP circuit based on the monitored buffer state;
wherein the ACM circuit is configured to receive and modulate the buffered data at a modulation format having a spectral efficiency, and to output the modulated buffered data on an output port of the DSP circuit;
wherein the modulation format is selected from a plurality of modulation formats based on a feedback signal received on an ACM feedback port of the DSP circuit; and
wherein the control circuit is configured to control the output power of the PA independently of any modulation of the buffered data by the ACM circuit.

14. The DSP circuit of claim 13, further comprising a limiter circuit, the limiter circuit configured to limit the power control signal to correspond to output powers above a pre-determined minimum output power of the PA and/or to correspond to output powers below a pre-determined maximum output power of the PA.

15. A device, comprising:
a Digital Signal Processor (DSP) circuit, comprising:
an input data port;
an adaptive coding and modulation (ACM) circuit;
a data buffer configured to receive data on the input data port and to output buffered data to the ACM circuit on an output data port;
a control circuit configured to monitor a buffer state of the data buffer, and to output a power control signal on a power control port of the DSP circuit for controlling an output power of a power amplifier (PA) connectable to the DSP circuit based on the monitored buffer state;
wherein the ACM circuit is configured to receive and modulate the buffered data at a modulation format having a spectral efficiency, and to output the modulated buffered data on an output port of the DSP circuit;
wherein the modulation format is selected from a plurality of modulation formats based on a feedback signal received on an ACM feedback port of the DSP circuit; and wherein the control circuit is configured to control the output power of the PA independently of any modulation of the buffered data by the ACM circuit.

16. A method, in a Digital Signal Processing (DSP) circuit, for controlling a spectral efficiency of data transmission by the DSP circuit; the DSP circuit comprising a data buffer and an adaptive coding and modulation(ACM) circuit, the ACM circuit configured to modulate buffered data received from the data buffer at a modulation format having a spectral efficiency, wherein the modulation format is selected from a plurality of modulation formats based on a feedback signal received on an ACM feedback port of the DSP circuit; the method comprising:
monitoring a buffer state of the data buffer; and
generating a power control signal based on the monitored buffer state, the power control signal for controlling an output power of a power amplifier (PA) connectable to the DSP circuit, wherein the power control signal is configured to control the output power of the PA independently of any modulation of the buffered data by the ACM circuit.

17. The method of claim 16, wherein the monitoring comprises monitoring a buffer fill level of the data buffer.

18. The method of claim 17, wherein the generating the power control signal comprises generating a power control signal for decreasing the output power of the PA when the buffer fill level is below a first predetermined threshold.

19. The method of claim 17, wherein the generating the power control signal comprises generating a power control signal for increasing the output power of the PA when the buffer fill level is above a second predetermined threshold.

20. The method of claim 16, wherein the monitoring comprises predicting a future buffer fill level of the data buffer.

21. The method of claim 20, wherein the generating the power control signal comprises generating the power control signal based on the predicted future buffer fill level.

22. The method of claim 20, wherein the generating the power control signal comprises generating a power control signal for decreasing the output power of the PA when the predicted future buffer fill level is below a first predetermined threshold.

23. The method of claim 20, wherein the generating the power control signal comprises generating a power control signal for increasing the output power of the PA when the predicted future buffer fill level is above a second predetermined threshold.

24. The method of claim 16, wherein the monitoring comprises monitoring a priority level of data currently in the data buffer.

25. The method of claim 24, wherein the generating the power control signal comprises:
generating a power control signal for increasing the output power of the PA when the priority level of data currently in the data buffer is above a priority threshold;
generating a power control signal for decreasing the output power of the PA when the priority level of data currently in the data buffer is below a priority threshold.

26. A computer program product stored in a non-transitory computer readable medium for controlling a spectral efficiency of data transmission by the Digital Signal Processing (DSP) circuit, the DSP circuit comprising a data buffer and an adaptive coding and modulation (ACM) circuit, the ACM circuit configured to modulate buffered data received from the data buffer at a modulation format having a spectral efficiency, wherein the modulation format is selected from a plurality of modulation formats based on a feedback signal received on an ACM feedback port of the DSP circuit, the computer program product comprising software instructions which, when run on the DSP, causes the DSP to:
monitor a buffer state of the data buffer; and
generate a power control signal based on the monitored buffer state, the power control signal for controlling an output power of a power amplifier (PA) connectable to the DSP circuit, wherein the power control signal is configured to control the output power of the PA independently of any modulation of the buffered data by the ACM circuit.

27. The microwave transceiver of claim 1, wherein the ACM circuit is configured to select a different modulation format to adjust spectral efficiency in response to the control circuit changing the output power of the PA.

* * * * *

UNITED STATES PATENT AND TRADEMARK OFFICE
CERTIFICATE OF CORRECTION

PATENT NO. : 9,590,763 B2
APPLICATION NO. : 14/442418
DATED : March 7, 2017
INVENTOR(S) : Hellgren et al.

Page 1 of 1

It is certified that error appears in the above-identified patent and that said Letters Patent is hereby corrected as shown below:

In Fig. 2, Sheet 2 of 6, for Tag "110", Line 1, delete "BUFFER" and insert -- DATA BUFFER --, therefor.

In Column 2, Line 8, delete "mean-time-before-failure" and insert -- mean-time-between-failure --, therefor.

In Column 3, Line 30, insert -- Fig. 6 is a block diagram illustrating a look-up-table according to the present disclosure. --, therefor.

In Column 3, Lines 65-66, delete "mean-time-before-failure" and insert
-- mean-time-between-failure --, therefor.

In Column 5, Lines 34-35, delete "signal to noise and interference ratio (SNIR)," and insert
-- signal-to-interference-plus-noise ratio (SINR), --, therefor.

In Column 5, Line 35, delete "squared detection" and insert -- squared --, therefor.

In Column 9, Line 59, in Claim 8, delete "transceiver claim" and insert -- transceiver of claim --, therefor.

In Column 9, Line 60, in Claim 8, delete "circuit-is" and insert -- circuit is --, therefor.

Signed and Sealed this
Seventeenth Day of July, 2018

Andrei Iancu
*Director of the United States Patent and Trademark Office*